United States Patent [19]

Barucchi et al.

[11] Patent Number: 5,511,078
[45] Date of Patent: Apr. 23, 1996

[54] METHOD AND APPARATUS FOR CORRECTION ERRORS IN A MEMORY

[75] Inventors: Gerard Barucchi, Villeneuve Loubet; Philippe Cuny, La Gaude; Philippe Klein, Cagnes-Sur-Mer; Olivier Maurel, Le Cannet; Jean-Luc Peter, Vence, all of France

[73] Assignee: International Business Machines Corporation, Armonk, N.Y.

[21] Appl. No.: 154,686

[22] Filed: Nov. 18, 1993

[30] Foreign Application Priority Data

Nov. 30, 1992 [EP] European Pat. Off. .............. 92480187

[51] Int. Cl.$^6$ ................................................. G06F 11/10
[52] U.S. Cl. ........................................ 371/40.1; 371/40.2
[58] Field of Search ................................. 371/37.1, 40.1, 371/40.2

[56] References Cited

U.S. PATENT DOCUMENTS 3,766,521 10/1973 Carter et al. .................. 340/146.1 AL
4,761,785 8/1988 Clark et al. ............................ 371/40.2
4,964,129 10/1990 Bowden, III et al. ................. 371/40.2

FOREIGN PATENT DOCUMENTS 0300139 4/1988 European Pat. Off. ..
0424301 9/1990 European Pat. Off. ..

OTHER PUBLICATIONS

8153 Computer, Jul. 23, 1990, No. 7, Los Alamitos, CA, US "Error Control Coding in Computers by Fujiwara", Pradhan, pp. 63-72.

Primary Examiner—Paul P. Gordon
Attorney, Agent, or Firm—Jerry W. Herndon

[57] ABSTRACT

The method and apparatus for correcting one B-bit block in error in a memory organized in words comprising N B-bit blocks consist of appending to the data bits to be written into the memory words a limited number of error correction bits computed from a depopulated parity check matrix which gives the capability of only correcting one block in error and improving the memory failure rate by cyclically reading each word, correcting a block found in error if any and writing the corrected data bits with the corresponding error correction bits in place of the read word.

7 Claims, 8 Drawing Sheets

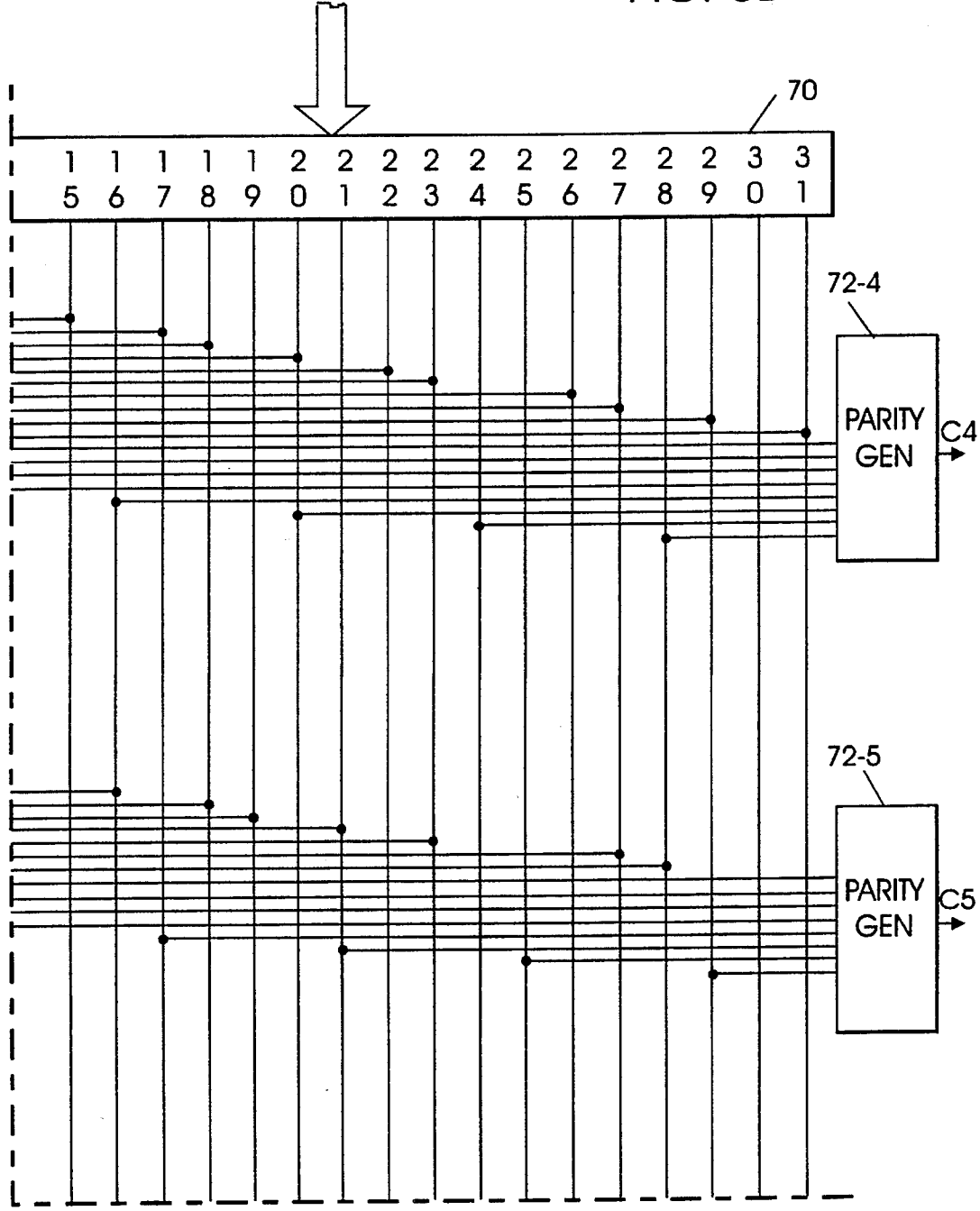

| FIG. 3A | FIG. 3B |
|---|---|
| FIG. 3C | FIG. 3D |

METHOD AND APPARATUS FOR CORRECTION ERRORS IN A MEMORY

DESCRIPTION OF THE INVENTION

The subject invention relates to an efficient error correction method and apparatus for optimizing packet error correction in a memory by using a limited number of error correction code bits.

BACKGROUND ART

Error correction and detection is one of the major problems to be solved when implementing a semi-conductor memory.

This problem is extensively addressed in the article "Error Correcting Codes for Semi-conductor Memory Applications: A State of the Art" by C. L. Chen and M. Y. Hsiao published in the IBM System Journal of Research and Development Volume 28, N[2 in Mar. 1984. This article is related to error correcting codes which are widely used for 1-bit error correction and 2-bit error detection and to block oriented error correction codes which may be used when the memory is organized in words comprising blocks of B-bits per block.

When each block comprises B=4 bits, twelve error correction bits need to be added to a 32-bit data word arranged in eight 4-bit blocks in order to be able to correct 1, 2, 3 or 4 bits in error in the same block and detect that two blocks are in error.

The aim of an error correction code is to improve the memory failure rate. There are two kinds of errors which may impair the failure rate, namely the permanent hard errors which have a low probability of occurrence but impairs the memory failure rate since they may affect several bits at one and the same time and the temporary soft errors which have a higher probability of occurrence but only affect one bit at one and the same time. The major contributors to the memory failure rate are the hard errors, the soft errors aligned with hard errors and the soft errors. Almost all known error correction codes are able to protect the memory against the two first error causes, this means that they are able to correct all errors in one module and detect several errors in two different modules.

The error correction codes known as single bit error correction/double bit error detection SEC/DED as described in above referenced article, allow a good failure rate to be obtained for a 32-bit word using 7 or 8 ECC bits when the memory is organized in 1-bit block.

The single block correction/double block detection code SBC/DBD, needs 12 ECC bits when a 32-bit memory word is organized in eight 4-bit blocks to reach the same failure rate. Generally, the memory comprises several modules and the different blocks of words are located in the different modules. Low cost memories comprised of 10 modules exist. But they cannot be used in environments where the memory reliability is a key factor.

SUMMARY OF THE INVENTION

An object of the present invention is an error correction method and apparatus using a limited number of error correction bits when implemented in a block organized memory while giving the memory a high reliability.

The method according to the present invention is used for correcting errors in a memory organized in words comprising N B-bit blocks including N1 B-bit blocks for storing data bits and N2 B-bit blocks for storing error correction bits (ECC) generated by using an error parity check matrix of the type $$H = \begin{vmatrix} I & I & I & \ldots & I & I & 0 & 0 \\ I & T & T^2 & \ldots & T^{2-2^B} & 0 & I & 0 \\ I & T^2 & T^4 & \ldots & T^{2(2-2)^B} & 0 & 0 & I \end{vmatrix}$$

where T is a B×B companion matrix, I is the B×B identity matrix and O is the B×B null matrix, said matrix allowing to generate error correction bits which make it possible to correct one block in error and detect two blocks in error. The method is characterized in that it comprises the step of: for each word to be stored into an addressed location of the memory, computing error correction bits to be appended to the data bits from a depopulated parity check matrix:

$$H = \begin{vmatrix} I & T & T^2 & \ldots & T^{2-2^B} & I & 0 \\ I & I & I & \ldots & I & 0 & I \end{vmatrix}$$

which gives the capability of only correcting one block in error, whereby a limited number of error correction bits are needed, and successively reading each stored word, correcting the data bit block in error, if any and computing the error correction bits to be appended to the corrected data bits and writing the corrected data bits and the computed error correction bits in place of the read word.

The present invention also relates to an apparatus for implementing said method.

BRIEF DESCRIPTION OF THE FIGURES

FIGS. 3, 3A, 3B, 3C, and 3D together represents the ECC bit computing circuit.

DETAILED DESCRIPTION OF THE FIGURES

Figure 1:
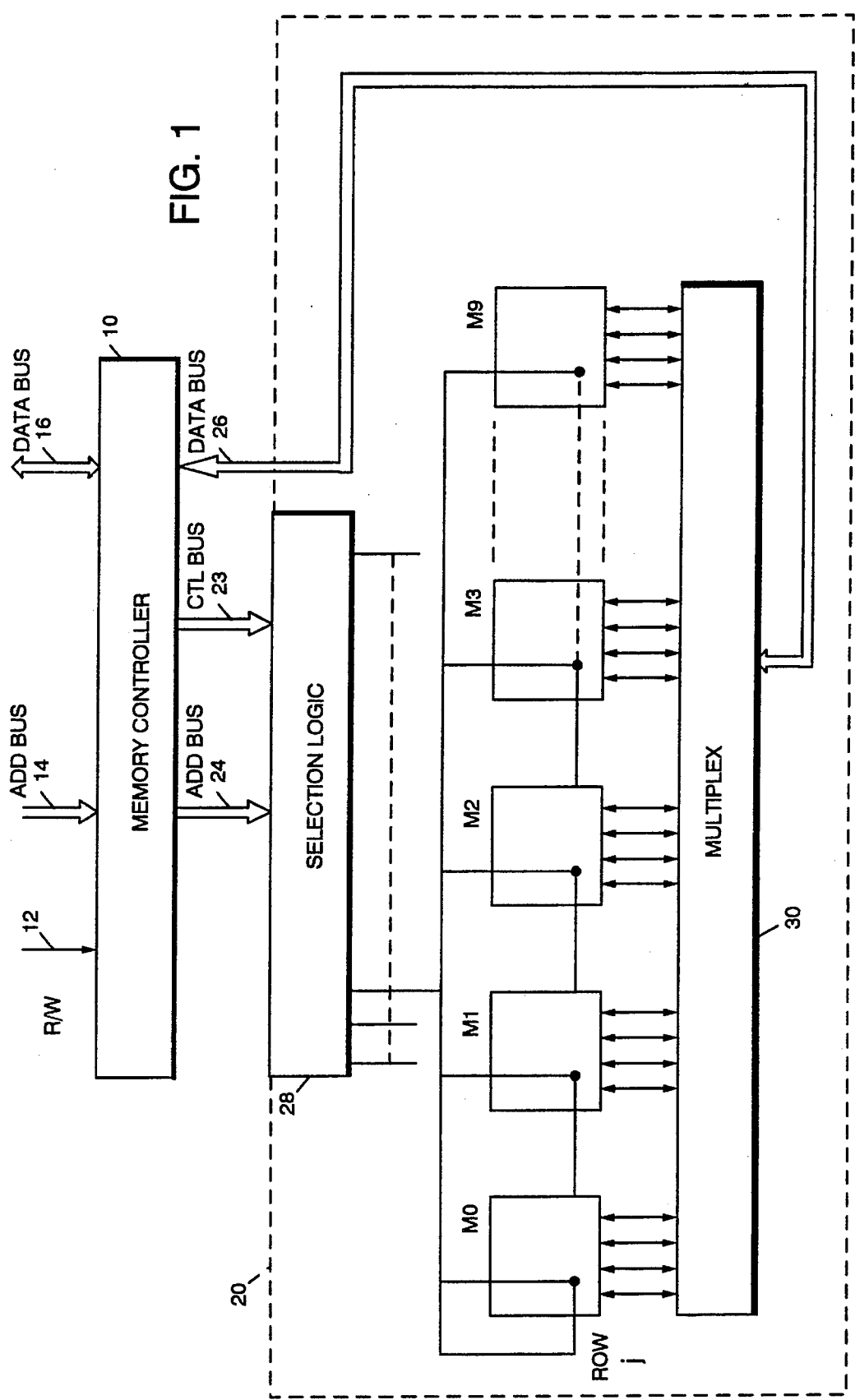
FIG. 1 represents the memory organization and memory controller circuit into which the method and apparatus according to the present invention may be implemented.

The present invention will be described in detail when implemented in a memory organized in 40-bit data words, where the words are stored in ten 4-bit blocks on different memory modules.

The method according to the present invention consists in appending to the 32-data bits organized in eight 4-bit modules, a limited 8-bit error correction code instead of the 12-bit error correction code of the conventional SBC/SBD code, so that said limited code is able to correct all bits in error in one block.

This error correction code will not make it possible to detect that two modules are in error in all error cases but will only be able to detect 50% of such errors.

To compensate the high failure rate which would be obtained if only this error correction code were used, the method comprises a "cleaning" step consisting in a cyclic efficient scrubbing routine to avoid the accumulation of soft errors.

This scrubbing routine consists in cyclically reading the words and correcting the bits in error if one module is found in error.

It results in a minimum overhead on the real memory accesses by taking advantage of the row selection made at the memory refresh cycles.

The limited error correction code is determined from the parity check Matrix H of the SBC/SBD code, by depopulating this matrix as described hereafter:

Let H be the parity check matrix of a SBC/DBD code for a memory word of 32 data bits:

$$H = \begin{vmatrix} I & I & I & \ldots & I & I & 0 & 0 \\ I & T & T^2 & \ldots & T^{2-2^B} & 0 & I & 0 \\ I & T^2 & T^4 & \ldots & T^{2(2-2)^B} & 0 & 0 & I \end{vmatrix}$$

let D be a data word of 32 bits $$D = \begin{vmatrix} D0 \\ D1 \\ D2 \\ D3 \\ D4 \\ D5 \\ D6 \\ D7 \end{vmatrix}$$

(Dn is one data block of 4 bits) and let CB be the 12 computed check bits associated to the code:

$$CB = \begin{vmatrix} CB0 \\ CB1 \\ CB2 \end{vmatrix}$$

(CBn is one check bit block of 4 bits) The SBC/DBD code properties (code linearity) can be described as follows:

$$H \cdot \left| \frac{D}{CB} \right| = 0 \quad (1)$$

"." is the matrix multiplication $$\left| \frac{D}{CB} \right|$$

is the written word (32 data bits+12 check bits) the read word can be modified by memory failures, let E be the 40 bits error word (the failure can damage data bits or check bits)

$$E = \begin{vmatrix} E0 \\ E1 \\ E2 \\ E3 \\ E4 \\ E5 \\ E6 \\ E7 \\ E8 \\ E9 \end{vmatrix}$$

(En is 4 bits wide) then the read word can be obtained from the written word as follows:

$$\frac{D'}{CB'} = \frac{D}{CB} + E$$

If no errors occur in the memory, then E=0 and then the read word is equal to the written word.

+ is the exclusive OR.

Let S define the error syndrome as follows:

$$S = H \cdot \frac{D'}{CB'} \quad (2)$$

If no error occurs then $$\frac{D'}{CB'} = \frac{D}{CB}$$

and then S=0

If at least one error occurs then S will be different From 0 from equation (2), the syndrome is 12-bits wide Define it as:

$$S = \begin{matrix} S0 \\ S1 \\ S2 \end{matrix}$$

(Sn is 4 bits wide)
Developing the formula (2) gives:

$$\begin{matrix} S0 \\ S1 \\ S2 \end{matrix} = \begin{vmatrix} I & I & I & \ldots & . & I & 0 & 0 \\ I & T & T^2 & \ldots & T^{2-2^B} & 0 & I & 0 \\ I & T^2 & T^4 & \ldots & T^{2(2-2)^B} & 0 & 0 & I \end{vmatrix} \cdot \begin{vmatrix} E0 \\ E1 \\ E2 \\ E3 \\ E4 \\ E5 \\ E6 \\ E7 \\ E8 \\ E9 \end{vmatrix}$$

$$\Rightarrow \begin{vmatrix} S0 = E0 + E1 & +E2 & +\ldots+E7 \\ S1 = E0 + T \cdot E1 & +T^2 \cdot E2 & +\ldots+E8 \\ S2 = E0 + T^2 \cdot E1 & +T^4 \cdot E2 & +\ldots+E9 \end{vmatrix} \text{ system of 3 equations}$$

According to the subject invention, the objective is to correct all errors in one block without any condition for the error detection in two different blocks, then only 2 information are necessary:

1) the localization of the block in error
2) the error distribution in this block.

This means that only 2 equations are necessary to solve our problem. It is preferred to note S0=s1 and S1=s0 in order to match with the following of the proof in the next chapter:

$$s0 = E0 + T.E1 + T^2.E2 + \ldots + E8$$

$$s1 = E0 + E1 + E2 + \ldots + E7$$

We have then a new reduced parity check matrix H:

$$H = \begin{vmatrix} I & T & T^2 & \ldots & T^{2-2^B} & I & 0 \\ I & I & I & \ldots & I & 0 & I \end{vmatrix}$$

If H is reduced, then the check bit word size is reduced too.

$$CB = \begin{vmatrix} CB0 \\ CB1 \end{vmatrix}$$

(8 bits only)

It will now be demonstrated how a specific matrix T is chosen.

In the preferred embodiment of the present invention, the memory words are organized in blocks of 4 bits, as will be described in reference to FIG. 1.

As a single error correction in the GF($2^4$) field is equivalent to correcting a block of 4 bits in the GF(2) binary field, a specific T matrix will be determined by calculating all members of GF($2^4$), i.e.

$(\alpha^0, \alpha^1, \ldots, \alpha^{2^4-1})$, and substitute some of them into the following H matrix:

$$H = \begin{bmatrix} \alpha^0 & \alpha^1 & \ldots & \alpha^{m-1} & 1 & 0 \\ 1 & 1 & \ldots & 1 & 0 & 1 \end{bmatrix} \quad (3)$$

⇧————⇧ ⇧ ⇧
m information   2 check
symbols         symbols where:

$\propto$ is a primitive element of GF($2^4$) represented by a 4×4 matrix such that $g(\propto)=0$ (with $\deg(g(x))=4$)

$m=32/4=8 \leq 2^4-1=15$.

Let choose a primitive polynomial of order 4 in GF(2) for example:

$g(x)=x^4+x+1$.

Members of GF($2^4$) are the residue classes of the polynomials in x (GF(2)[x]) with coefficients from GF(2) reduced modulo $g(x)$.

Elements of GF($2^4$) may be described as:
binary 4-tuples
binary 4×4 matrices

Let $\propto$ denote the residue classes of x itself, from the construction of GF($2^4$), $g(\propto)=0$. Then GF($2^4$) consists of all polynomials in $\propto$ of degree $\leq 3$ with coefficients from GF(2).

An element of GF($2^4$) is:

$a_0+a_1\propto+a_2\propto^2+a_3\propto^3$ for a 4-tuple description $a_0+a_1T+a_2T^2+a_3T^3$ for a T=4×4 matrix description with:

$a_i \epsilon GF(2)$ $g(\propto)=0 \text{ or } g(T)=0$

The representation with 4-tuples is as follows:

Let's perform the residue classes of all polynomials $\propto^i$ reduced modulo $g(\propto)$:

$\propto^0=g(\propto)(0)+1$ $\propto^1 g(\propto)(0)+\propto$ $\propto^2=g(\propto)(0)+\propto^2$ $\propto^3=g(\propto)(0)+\propto^3$ $\propto^4=g(\propto)(f_1(\propto))+\propto+1$ $\propto^5=g(\propto)(f_2(\propto))+\propto^2+\propto$ $\propto^6=g(\propto)(f_3(\propto))+\propto^3+\propto^2$ $\propto^7=g(\propto)(f_4(\propto))+\propto^3+\propto+1$ $\propto^8 g(\propto)(f_5(\propto))+\propto^2+1$ $\propto^9=g(\propto)(f_6(\propto))+\propto^3+\propto$ $\propto^{10}=g(\propto)(f_7(\propto))+\propto^2+\propto+1$ $\propto^{11}=g(\propto)(f_8(\propto))+\propto^3+\propto^{2+\propto}$ A representation of GF($2^4$) with 4-tuples is (since $g(\propto)=0$):

| $\alpha^0$ | $\alpha^1$ | $\alpha^2$ | $\alpha^3$ | $\alpha^4$ | $\alpha^5$ |
|---|---|---|---|---|---|
| 0 | 0 | 0 | 1 | 0 | 0 |
| 0 | 0 | 1 | 0 | 0 | 1 |
| 0 | 1 | 0 | 0 | 1 | 1 |
| 1 | 0 | 0 | 0 | 1 | 0 |

| $\alpha^6$ | $\alpha^7$ | $\alpha^8$ | $\alpha^9$ | $\alpha^{10}$ | $\alpha^{11}$ |
|---|---|---|---|---|---|
| 1 | 1 | 0 | 1 | 0 | 1 |
| 1 | 0 | 1 | 0 | 1 | 1 |
| 0 | 1 | 0 | 1 | 1 | 1 |
| 0 | 1 | 1 | 0 | 1 | 0 |

| $\alpha^{12}$ | $\alpha^{13}$ | $\alpha^{14}$ | $\alpha^{15}$ |
|---|---|---|---|
| 1 | 1 | 1 | 0 |
| 1 | 1 | 0 | 0 |
| 1 | 0 | 0 | 0 |
| 1 | 1 | 1 | 1 |

There are $2^4-1=15$ distinct 4-tuples over GF(16).

GF(16) representation with 4×4 matrices

All members of GF($2^4$) with 4×4 matrix representation, are calculated i.e.:

$(I, T, \ldots, T^{2-2^4})$ and some of them are substituted into the following H matrix:

$$H = \begin{bmatrix} I & T & \ldots & T^{m-1} & I & 0 \\ I & I & \ldots & I & 0 & I \end{bmatrix} \quad (3)$$

⇧————⇧ ⇧ ⇧
m information   2 check
symbols         symbols where:

T is a primitive element of GF($2^4$) represented by a 4×4 matrix such that $g(T)=0$ (with $\deg(g(x))=4$)

$m=32/4=8\leq 2^4-1=15$

Let choose the primitive polynomials of order 4 in GF(2):

$$g(x)=x^4+x+1.$$

Members of GF($2^4$) are the residue classes of the polynomials in x (GF(2)[x]) with coefficients from GF(2) reduced modulo g(x).

Elements of GF($2^4$) may be described as binary 4×4 matrices

Let T denote the residue classes of x itself; from the construction of GF($2^4$), g(T)=0.

Then GF($2^4$) consists of all polynomials in T of degree $\leq$ 3 with coefficients from GF(2). An element of GF($2^4$) is:

$$a_0+a_1T+a_2T^2+a_3T^3$$

for a T=4×4 matrix description with:

$$a_i \epsilon GF(2)$$

$$g(T)=0$$

There are $2^4-1=15$ distinct 4-tuples over GF(16).
Determination of T matrix
T matrix has the following properties:
1. T is a 4×4 matrix
2. T is composed of 4-tuples of GF($2^4$)
3. g(T)=0

It is needed to find among the elements of GF($2^4$) ($\propto^0, \propto^1, \ldots, \propto^{24}-1$), four 4-tuples which follows equation g(T)=0.

If we choose T= ($\propto^3, \propto^2, \propto^1, \propto^0$)
then:

$$T = \begin{vmatrix} 1 & 0 & 0 & 0 \\ 0 & 1 & 0 & 0 \\ 0 & 0 & 1 & 0 \\ 0 & 0 & 0 & 1 \end{vmatrix}.$$

That case is not possible because T=I (identity matrix) and g(T)=0 is not true.

Let choose T=($\propto^4, \propto^3, \propto^2, \propto^1$) then:

$$T = \begin{vmatrix} 0 & 1 & 0 & 0 \\ 0 & 0 & 1 & 0 \\ 1 & 0 & 0 & 1 \\ 1 & 0 & 0 & 0 \end{vmatrix}$$

In that case the equation g(T)=0 is true.
This gives the following T matrix:

$$T = \begin{vmatrix} 0 & 1 & 0 & 0 \\ 0 & 0 & 1 & 0 \\ 1 & 0 & 0 & 1 \\ 1 & 0 & 0 & 0 \end{vmatrix}$$

$$T^2 = \begin{vmatrix} 0 & 0 & 1 & 0 \\ 1 & 0 & 0 & 1 \\ 1 & 1 & 0 & 0 \\ 0 & 1 & 0 & 0 \end{vmatrix}$$

$$T^3 = \begin{vmatrix} 1 & 0 & 0 & 1 \\ 1 & 1 & 0 & 0 \\ 0 & 1 & 1 & 0 \\ 0 & 0 & 1 & 0 \end{vmatrix}$$

$$T^4 = T+I = \begin{vmatrix} 1 & 1 & 0 & 0 \\ 0 & 1 & 1 & 0 \\ 1 & 0 & 1 & 1 \\ 1 & 0 & 0 & 1 \end{vmatrix}$$

$$T^5 = T^2+T = \begin{vmatrix} 0 & 1 & 1 & 0 \\ 1 & 0 & 1 & 1 \\ 0 & 1 & 0 & 1 \\ 1 & 1 & 0 & 0 \end{vmatrix}$$

$$T^6 = T^3+T^2 = \begin{vmatrix} 1 & 0 & 1 & 1 \\ 0 & 1 & 0 & 1 \\ 1 & 0 & 1 & 0 \\ 0 & 1 & 1 & 0 \end{vmatrix}$$

$$T^7 = T^3+T+I = \begin{vmatrix} 0 & 1 & 0 & 1 \\ 1 & 0 & 1 & 0 \\ 1 & 1 & 0 & 1 \\ 1 & 0 & 1 & 1 \end{vmatrix}$$

$$T^8 = T^2+I = \begin{vmatrix} 1 & 0 & 1 & 0 \\ 1 & 1 & 0 & 1 \\ 1 & 1 & 1 & 0 \\ 0 & 1 & 0 & 1 \end{vmatrix}$$

$$T^9 = T^3+T = \begin{vmatrix} 1 & 1 & 0 & 1 \\ 1 & 1 & 1 & 0 \\ 1 & 1 & 1 & 1 \\ 1 & 0 & 1 & 0 \end{vmatrix}$$

$$T^7 = T^3+T+I = \begin{vmatrix} 0 & 1 & 0 & 1 \\ 1 & 0 & 1 & 0 \\ 1 & 1 & 0 & 1 \\ 1 & 0 & 1 & 1 \end{vmatrix}$$

$$T^{10} = T^2+T+I = \begin{vmatrix} 1 & 1 & 1 & 0 \\ 1 & 1 & 1 & 1 \\ 0 & 1 & 1 & 1 \\ 1 & 1 & 0 & 1 \end{vmatrix}$$

$$T^{11} = T^3+T^2+T = \begin{vmatrix} 1 & 1 & 1 & 1 \\ 0 & 1 & 1 & 1 \\ 0 & 0 & 1 & 1 \\ 1 & 1 & 1 & 0 \end{vmatrix}$$

$$T^{12} = T^3+T^2+T+T = \begin{vmatrix} 0 & 1 & 1 & 1 \\ 0 & 0 & 1 & 1 \\ 0 & 0 & 0 & 1 \\ 1 & 1 & 1 & 1 \end{vmatrix}$$

$$T^{13} = T^3+T^2+I = \begin{vmatrix} 0 & 0 & 1 & 1 \\ 0 & 0 & 0 & 1 \\ 1 & 0 & 0 & 0 \\ 0 & 1 & 1 & 1 \end{vmatrix}$$

$$T^{14} = T^3+I = \begin{vmatrix} 0 & 1 & 1 & 0 \\ 1 & 0 & 0 & 0 \\ 0 & 1 & 0 & 0 \\ 0 & 0 & 1 & 1 \end{vmatrix}$$

To determine the H parity check matrix it is needed to choose a subset of 8 matrix belonging to:

$$I, T, T^2, T^3, T^4, T^5, \ldots, T^{14}$$

For simplicity of decoding, the matrix which will have a minimum number of 1 will be chosen to simplify the ECC encoder, (it means a minimum XOR gate in the ECC decoder). The optimal choice is:

$$I, T, T^2, T^3, T^5, T^6, T^{13}, T^{14}$$

Therefore, from matrix (3) we obtain the final H matrix:

$$H = \begin{bmatrix} I & T^1 & T^2 & T^3 & T^5 & T^6 & T^{13} & T^{14} & I & 0 \\ I & I & I & I & I & I & I & I & 0 & I \end{bmatrix}$$

⇧_____⇧  ⇧ ⇧
   8 information symbols      2 check symbols $$H = \begin{bmatrix} 1000 & 0100 & 0010 & 1001 & 0110 & 1011 & 0011 & 0001 & 1000 & 0000 \\ 0100 & 0010 & 1001 & 1100 & 1011 & 0101 & 0001 & 1000 & 0100 & 0000 \\ 0010 & 1001 & 1100 & 0110 & 0101 & 1010 & 1000 & 0100 & 0010 & 0000 \\ 0001 & 1000 & 0100 & 0010 & 1100 & 0110 & 0111 & 0111 & 0001 & 0000 \\ 1000 & 1000 & 1000 & 1000 & 1000 & 1000 & 1000 & 1000 & 0000 & 1000 \\ 0100 & 0100 & 0100 & 0100 & 0100 & 0100 & 0100 & 0100 & 0000 & 0100 \\ 0010 & 0010 & 0010 & 0010 & 0010 & 0010 & 0010 & 0010 & 0000 & 0010 \\ 0001 & 0001 & 0001 & 0001 & 0001 & 0001 & 0001 & 0001 & 0000 & 0001 \end{bmatrix}$$

Thus, according to the present invention, the ECC bits to be appended to the data bits are generated by using this depopulated matrix. A scrubbing routine is implemented which consists in periodically reading the words from the memory, correcting the words containing one block in error and re-writing the corrected words.

This routine is intended to clean, according to the ECC performances, the soft errors which may occur in the memory blocks. It is achieved by a READ-MODIFY-WRITE memory operation. A Scrubbing Request is always sent to the memory controller after a Refresh Request (the refresh is mandatory for dynamic memories).

FIG. 1 represents the memory organization. The memory accesses are controlled by a memory controller 10 which receives memory access control signals from memory users and receives the data bits to be written into the memory or provides the data bits read from the memory. The control signals are a Read/Write control signal on line 12 and address signals on address bus 14. The data bits are received or provided on data bus 16. The block diagram of the memory controller is shown in FIG. 2.

The memory controller 10 provides to memory 20 access control signals on control bus 23 and memory addresses on bus 24 to a selection logic circuit 28 which generates therefrom the selection signals for reading or writing an addressed word.

The memory comprises ten memory modules M0 to M9. In a preferred embodiment of the present invention, each module comprises 1024 rows and 1024 columns of 4-bit blocks. A word is selected by activating a column line, COL i and a row line ROW j for each module M0 to M9, which allows a 40-bit word to be read or written. The four bits from the selected block in each module are provided to data bus 26 through multiplexing circuit 30 and the bits to be written are provided to the selected blocks from bus 26 through multiplexing circuit 30.

Figure 2:
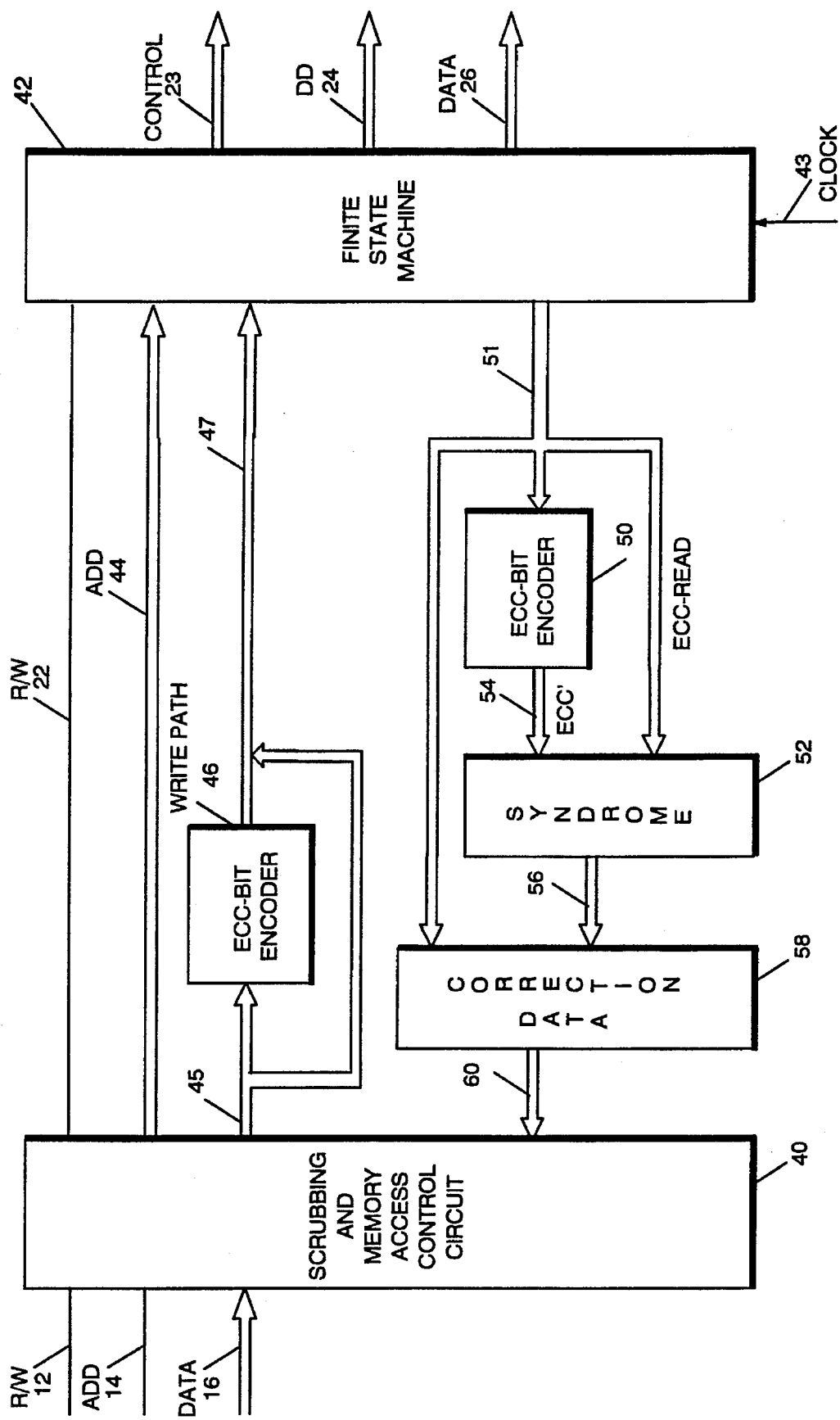
FIG. 2 represents the apparatus according to the present invention.

The memory controller is shown in FIG. 2. It comprises a scrubbing and memory access control circuit 40 which receives the memory requests from memory users through R/W line 12, address bus 14 and data bus 16 and also generates scrubbing requests which cause selected words to be read, corrected if needed and re-written into the memory.

In response to a memory user request or a scrubbing request a R/W control signal is provided on line 22 to finite state machine 42 together with the word address on bus 44. The finite state machine 42 generates the memory access control signals on control bus 23 and the address on bus 24.

The 32-bit word to be written into the memory is provided by circuit 40 to an ECC bit encoder 46 through bus 45. The encoder 46 computes the eight ECC bits to be appended to the 32-bit word, so that the 40-bit word to be written into the memory is provided on bus 47 to finite state machine 42.

The ECC bit encoder 46 generates the 8 ECC bits: c0 to c7 to be appended to the data bits d0 to d31 using the simplified matrix H. Each ECC bit c0 to c7 is the parity bit of the eight bit-fields defined by the 1 in the rows of the simplified matrix H. For example, c0 is the parity bit of the field comprising d0, d5, d10, d12, d15, d17, d18, d20, d22, d23, d26, d27, d31 defined by the 1 in the first row.

The data words read from the memory are provided by finite state machine 42 on 40-bit bus 51. The 32 data bits are provided to ECC bit encoder 50 which computes ECC' bits c'0 to c'7 from the read data bits. Circuit 50 is similar to circuit 46. The ECC' bits c'0 to c'7 are provided to error syndrome generating circuit 52 through bus 54. Circuit 52 also receives the ECC bits c0 to c7 bits read from the memory, it generates from the ECC and ECC' bits, an error syndrome on bus 56. The error syndrome from bus 56 is provided to error correction circuit 58 which correct the bits in error in the read data and provides the corrected data bits to the scrubbing and memory access control circuit 40 through bus 60.

The error syndrome is obtained by XORing the ECC and ECC' bits. There is a specific error syndrome for each memory block in error and bits in error within the block. For example if bits 0 and 2 of block in module M0 are in error the error syndrome is 11001100.

The error syndrome and the read data bits from bus 51 are provided to the data correction circuit 58. Data correction circuit 58 comprises a correspondence table between the syndromes and bits in error within the 4-bit blocks in memory modules M0 to M9. By comparing the computed error syndrome with the possible error syndromes in the table, the positions of the bits in error in a module are found and may be corrected by inverting the bits in error to provide the corrected word on bus 60.

Figure 3A:
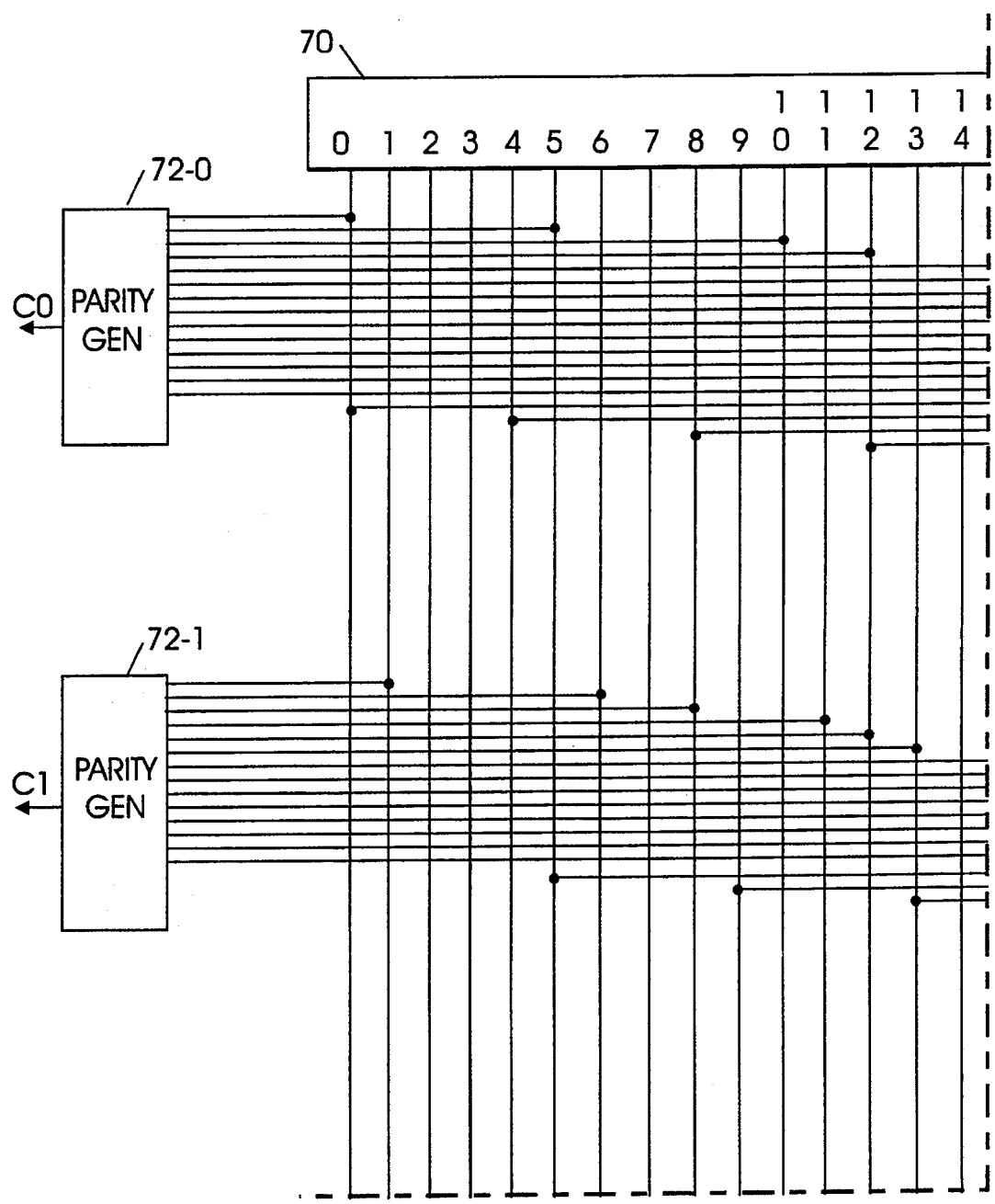
Figure 3C:
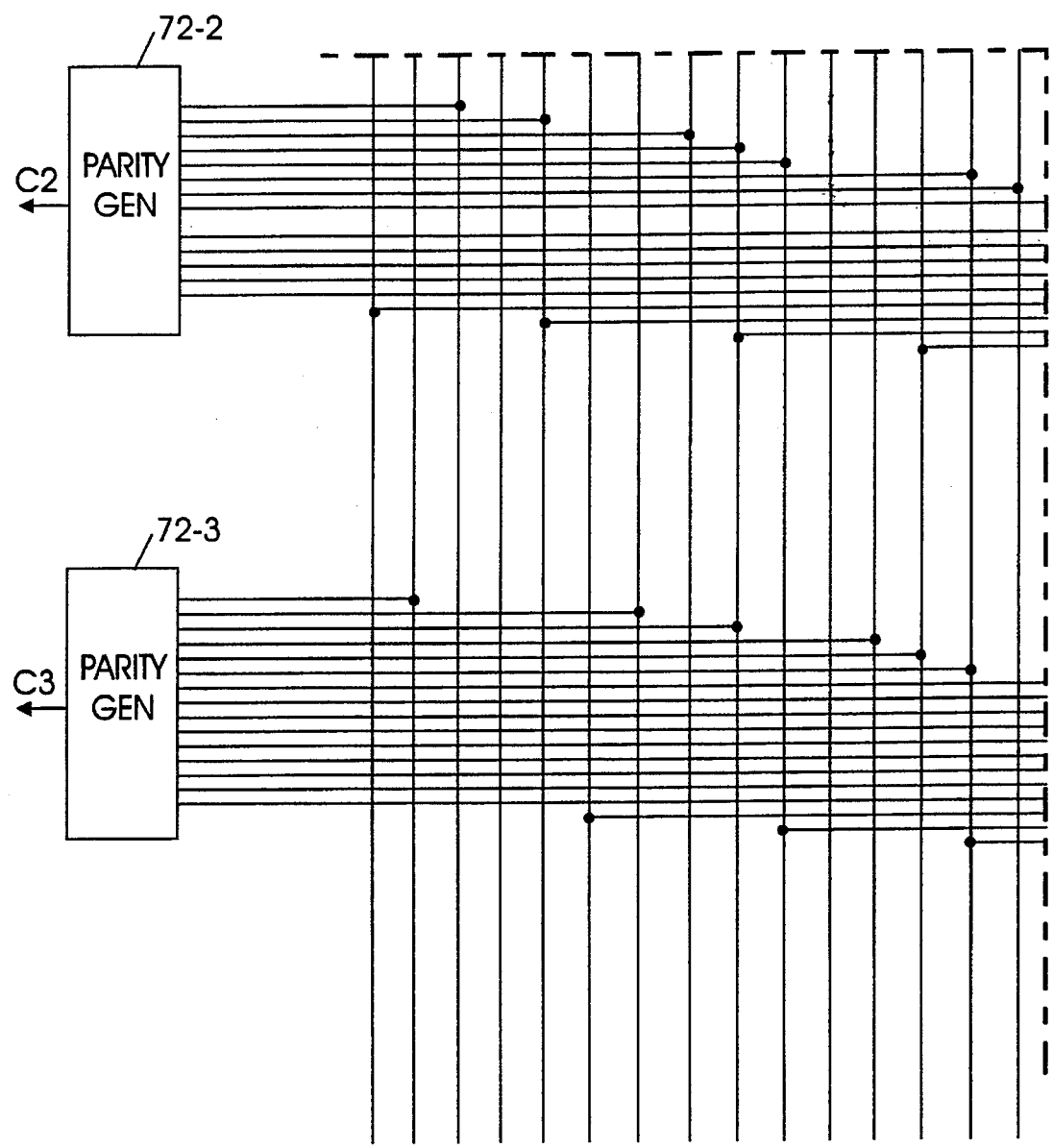
Figures 3, 3D:
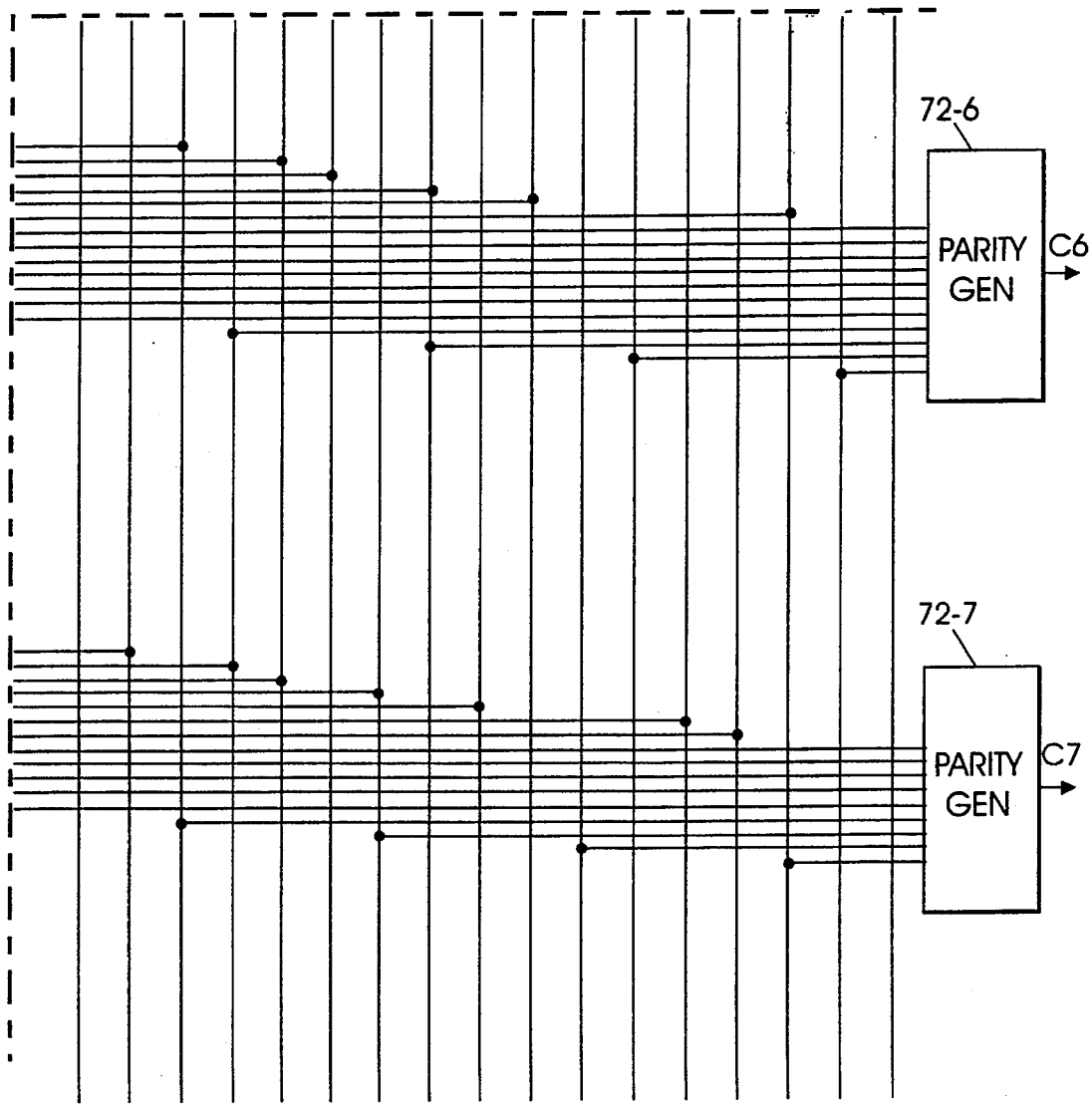

An ECC encoder circuit which may be used as circuit G6 is shown in FIG. 3. The 32-bit: d0 to d31 of the word to be written into the memory are provided from bus 45 into a 32-bit register 70. The check bits c0 to c7 are generated by eight parity generators 72-0 to 72-7, which receive as inputs selected bits among bits d0 to d31, as determined by the parity check matrix H. Parity generators 72-0 to 72-3 have thirteen inputs which receive the data bits determined by the "1" in the rows 0 to 3 of matrix H and parity generators 72-4 to 72-7 have eight inputs which receive the data bits determined by the "1" in the rows 4 to 7 of matrix H.

A similar circuit can be used for implementing the ECC-bit encoder 50 in the read path.

As previously described, the limited number of error correction bits allow only the bits in error in one block to be corrected. Bits in error in two blocks cannot be detected.

A scrubbing routine is implemented by scrubbing and memory access control circuit 40, for cleaning the errors in the memory.

Figure 4:
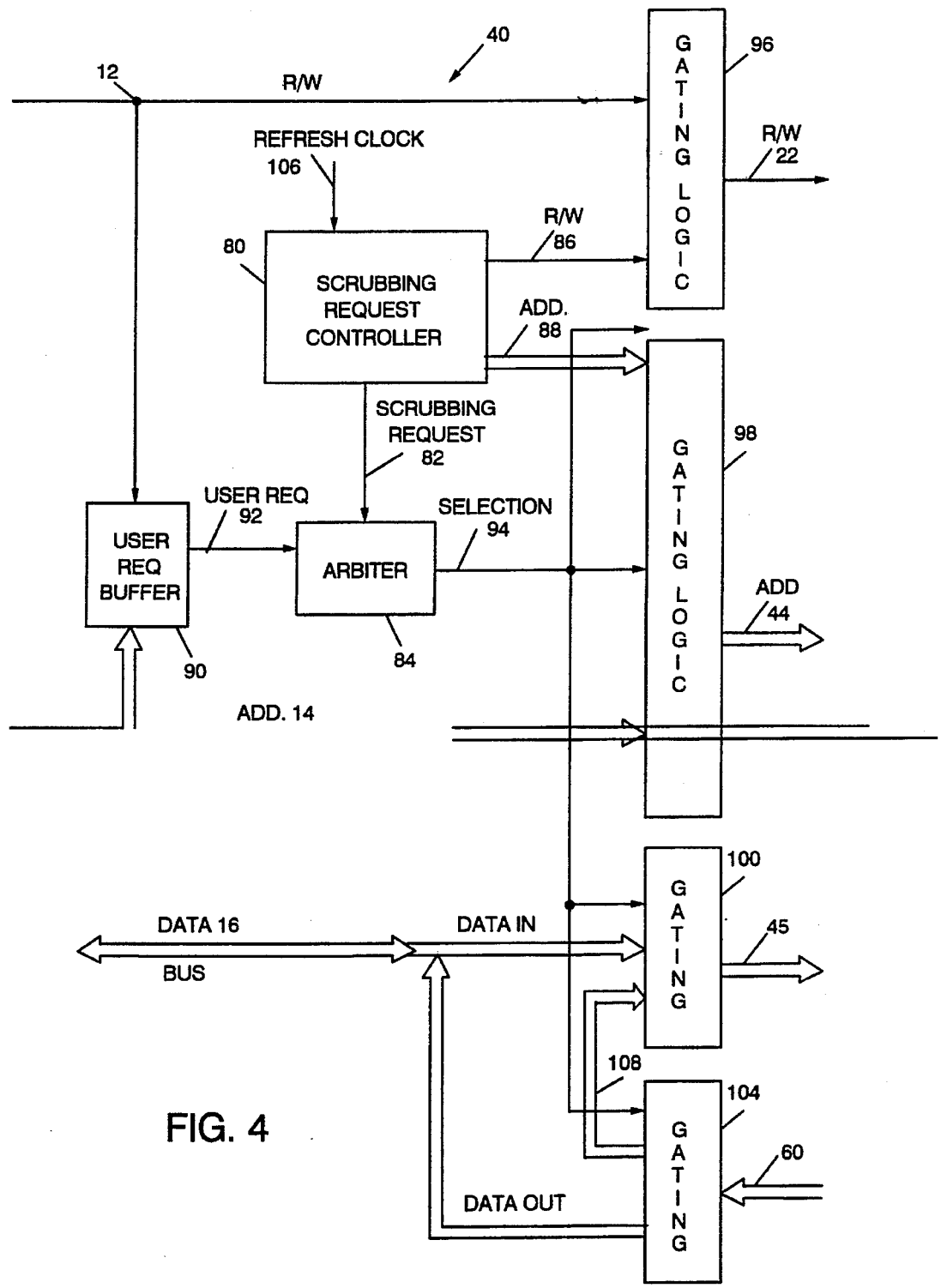
FIG. 4 represents the scrubbing and memory access control circuit of FIG. 2.

The scrubbing and memory access control circuit 40 is shown in FIG. 4. It comprises a scrubbing request controller 80 which provides a scrubbing request signal on line 82 to a memory access arbiter 84, a R/W signal on line 86 and a memory word address on bus 88. A scrubbing request is raised under control of the refresh clock signal on line 106, in a preferred embodiment of the present invention. Thus, the implementation of the scrubbing routine does not impair the memory performance, since the scrubbing routine takes place under control of the refresh operation which is mandatory in dynamic memories, as will be described later on.

The R/W signal on line 12 and the memory word address on bus 14 provided to circuit 40 from the memory users are provided to a memory request buffer 90 which provides a user request 92 to arbiter Arbiter receives the user requests and scrubbing requests. If no scrubbing request is raised, the arbiter provides a gating signal on line to gating logic circuits 96, 98, 100 which gate the R/W signal from line 12 and the address from bus 14 respectively to R/W line 22 and address bus 44. In addition the gating signal from line 94 is provided to gating logic circuits 100 and 104 which gate the word to be written into the memory on bus 45 or the corrected word read from the memory from bus 60 to bus 16, respectively. Thus if no scrubbing request is raised the user request is executed.

If a scrubbing request is raised, the current user request is processed and the next requests are freezed, i.e. are not selected by the arbiter and stacked in user request buffer 90. Arbiters 84 provides a gating signal on line 94 to the gating logic circuits 96,98, 100, 104 which causes the address on bus 88 and the R/W control signal on line 86 generated by the scrubbing request controller 86 to be gated on address bus 44 and line 22,. Then a read operation is performed through the ECC read path, and the read data from bus 60 (which has been corrected in case a correctable error was found) is gated on bus 108 by gating logic circuit 104 at the input of gating logic circuit 100. Then, the read word on bus 108 is provided by gating logic circuit 100 on bus 45 with a write control signal on line 22 to re-write the corrected word in the memory.

Figure 5:
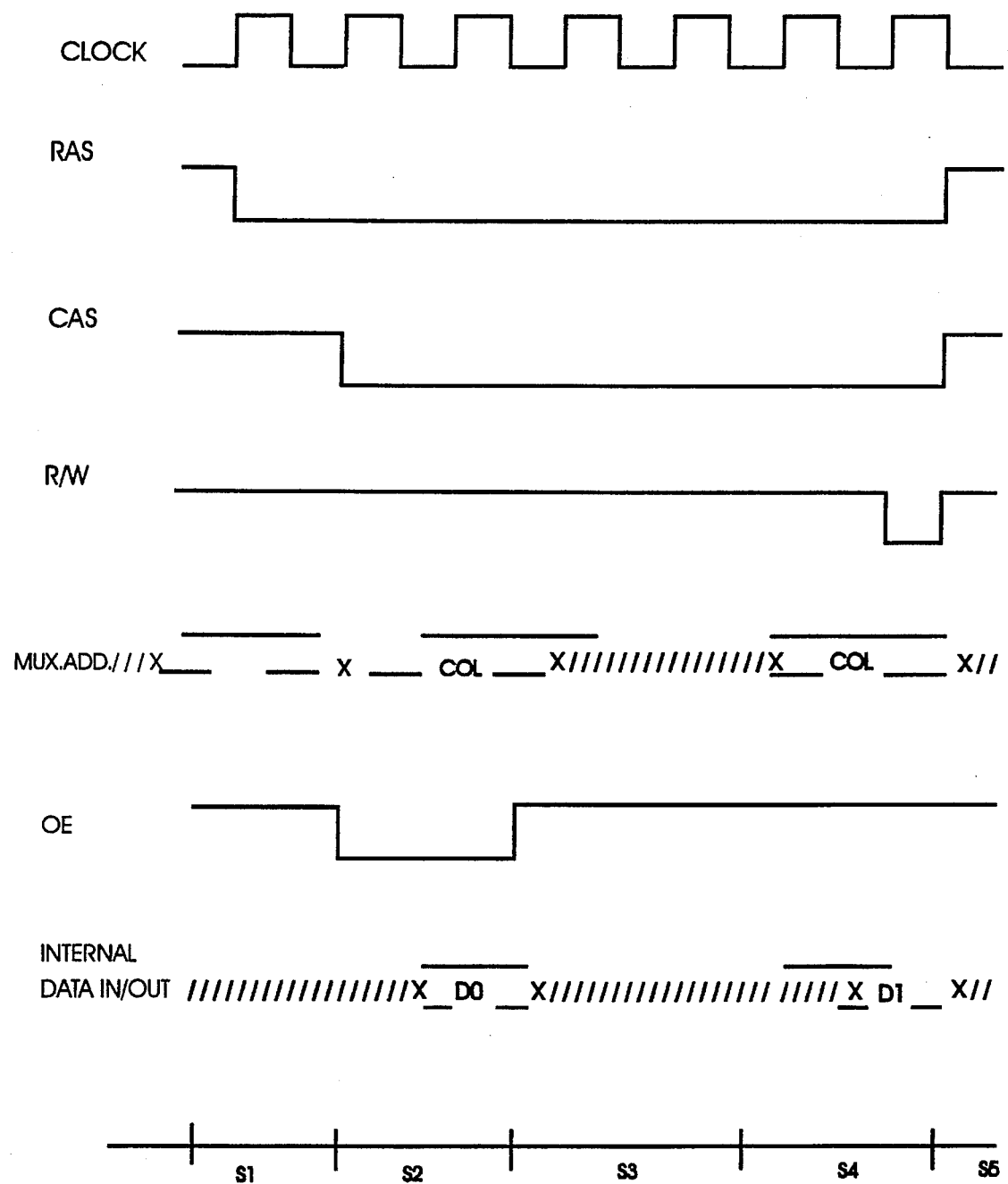
FIG. 5 represents the timing diagram of a memory operation performed in response to a scrubbing request.

FIG. 5 represents the timing diagram of a read modify write operation implemented by the scrubbing routine.

The scrubbing machine comprises an address counter, which is incremented at each scrubbing request, so as to be able to address sequentially all the memory words.

The finite state machine 42 uses 5 elementary states to perform a memory access, under control of an internal clock signal shown in FIG. 5.

These states are:
S1: address valid
S2: read data D0
S3: modify cycle used to correct eventually the data D0 which becomes D1
S4: write data D1 (eventually corrected by ECC)
S5: pre-charge before other access In the timing diagram, the abbreviations means:
RAS: Row Address Strobe (one line of control bus 23)
CAS: Column Address Strobe (one line of control bus 23)
W/R: R/W (write low) (one line of control bus 23)
OE: Data outputs enabled (active low)(one line of control bus 23)
MUX ADD: Row/Col address inputs on address bus 24
D.IN/OUT: bidirectional internal Data In/Data Out memory bus 26
////: Don't care This new code has the same possibility of extension as the initial SBC/DED, it means that this code can be successfully used with data word up to 60 bits wide. Also, it could be still extended by using more error correction bits and selecting the error parity check matrix accordingly.

We claim:

1. A method for correcting errors in a memory organized in words comprising N B-bit blocks including N1 B-Bit blocks for storing data bits and N2 B-bit blocks for storing error correction bits (ECC) generated by using an error parity check matrix of a type $$H = \begin{vmatrix} I & I & I & \ldots & I & I & 0 & 0 \\ I & T & T^2 & \ldots & T^{2-2^B} & 0 & I & 0 \\ I & T^2 & T^4 & \ldots & T^{2(2-2)^B} & 0 & 0 & I \end{vmatrix}$$

where T is a B×B companion matrix, 1 is the B×B identity matrix and O is the B×B null matrix, said H matrix allowing to generate error correction bits which make it possible to correct one block in error and detect two blocks in error, said method being characterized in that it comprises the steps of:

for each word to be stored into an addressed location of the memory, computing error correction bits for the word using a depopulated parity check matrix:

$$H = \begin{vmatrix} I & T & T^2 & \ldots & T^{2-2^B} & I & 0 \\ I & I & I & \ldots & I & & 0 & I \end{vmatrix}$$

which gives the capability of only correcting one block in error, whereby a limited number of error correction bits are needed, appending the computed error correction bits to the data bits to form a write word storing the write word at the addressed location of the memory, for each word read from memory, testing the word for an error using the error correction bits stored with the word, correcting an error if found in a read word, and periodically refreshing all error correction bits stored in the memory by successively reading each stored word, computing the error correction bits for the word, correcting the word if necessary, appending the error correction bits to the data bits and writing the corrected data bits and the computed error correction bits in place of the read word.

2. The method according to claim 1, characterized in that B is equal to 4 and N is lower than 16.

3. The method according to claim 2, characterized in that N is equal to 10 and the parity check matrix is:

$$H = \begin{bmatrix} I & T^1 & T^2 & T^3 & T^5 & T^6 & T^{13} & T^{14} & I & 0 \\ I & I & I & I & I & I & I & I & 0 & I \end{bmatrix}$$

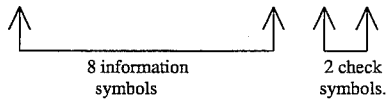

8 information symbols — 2 check symbols.

4. The method according to claim 3 characterized in that the companion matrix T is:

$$T = \begin{matrix} 0 & 1 & 0 & 0 \\ 0 & 0 & 1 & 0 \\ 1 & 0 & 0 & 1 \\ 1 & 0 & 0 & 0 \end{matrix}$$

5. An apparatus for correcting errors in a memory organized in words comprising N B-bit blocks including N1 B-bit blocks for storing data bits and N2 B-bit blocks for storing error correction bits (ECC) computed from a depopulated parity check matrix:

$$H = \begin{vmatrix} I & T & T^2 & \ldots & T^{2-2^B} & I & 0 \\ I & I & I & \ldots & I & 0 & I \end{vmatrix}$$

of a type comprising:

memory addressing means (40,42) for addressing a selected word location, writing means (45) for receiving the data bits to be written into a selected memory location, said writing means including means for computing the error correction bits to be appended to the data bits using the parity check matrix and means for writing the data bits and computed error correction bits at the selected memory location, reading means (50,52,60) for receiving a word read from a selected word location and means for generating therefrom an error syndrome using the parity check matrix, correcting means (58) which are responsive to the error syndrome for correcting the read data bits, said apparatus being characterized in that the memory addressing means further comprises means (80) for cyclically generating memory access requests for sequentially addressing each memory word, means for reading each addressed word through the reading means and means for writing the corrected word through the writing means.

6. The apparatus according to claim 5 characterized in that B is equal to 4, N is equal to 10 and N2 is equal to 2 and the parity check matrix is:

$$H = \begin{bmatrix} I & T^1 & T^2 & T^3 & T^5 & T^6 & T^{13} & T^{14} & I & 0 \\ I & I & I & I & I & I & I & I & 0 & I \end{bmatrix}$$

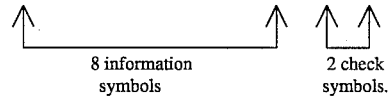

8 information symbols — 2 check symbols.

7. The apparatus according to claim 6 characterized in that the companion matrix T is the following:

$$T = \begin{matrix} 0 & 1 & 0 & 0 \\ 0 & 0 & 1 & 0 \\ 1 & 0 & 0 & 1 \\ 1 & 0 & 0 & 0 \end{matrix}$$

* * * * *